(12) United States Patent
Lee et al.

(10) Patent No.: US 6,348,415 B1
(45) Date of Patent: Feb. 19, 2002

(54) PLANARIZATION METHOD FOR SEMICONDUCTOR DEVICE

(75) Inventors: Tae Young Lee; Jae Suk Lee, both of Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 09/472,556

(22) Filed: Dec. 27, 1999

(30) Foreign Application Priority Data

Dec. 29, 1998 (KR) .............................................. 98-59983

(51) Int. Cl.[7] .................. H01L 21/302; H01L 21/4763; H01L 21/461; H01L 21/42
(52) U.S. Cl. ........................ 438/692; 438/622; 438/623; 438/633; 438/697; 438/693; 438/699; 438/631; 438/792
(58) Field of Search .................. 438/692, 697, 438/633, 699, 698, 631, 632, 792, 791, 780, 760, 622, 623, 626

(56) References Cited

U.S. PATENT DOCUMENTS

| | | | | |
|---|---|---|---|---|
| 5,716,890 A | * | 2/1998 | Yao | 438/624 |
| 6,159,842 A | * | 12/2000 | Chang et al. | 438/622 |
| 6,162,723 A | * | 12/2000 | Tanaka | 438/638 |
| 6,171,945 B1 | * | 1/2001 | Mandal et al. | 438/622 |

* cited by examiner

*Primary Examiner*—Charles Bowers
*Assistant Examiner*—Thanhha Pham

(57) ABSTRACT

This invention discloses a planarization method for semiconductor device. The planarization method includes the steps of: providing a semiconductor substrate in which metal patterns are formed with various pattern densities; depositing a porous oxide layer over the semiconductor substrate so as to cover the metal patterns; plasma-treating surface of the porous oxide layer; and polishing the plasma-treated porous oxide layer by chemical mechanical polishing.

8 Claims, 3 Drawing Sheets

PLANARIZATION METHOD FOR SEMICONDUCTOR DEVICE

BACKGROUND OF THE INVENTION

1. Field of the Invention

This invention relates to a planarization method for semiconductor device, more particularly to a planarization method for semiconductor device capable of obtaining the global planarization with a selective CMP by simply performing surface treatment at an $O_3$-TEOS layer.

2. Description of the Related Art

As the integrity of integrated circuits increases, a global planarization of interlayer dielectric by using CMP (Chemical Mechanical Polishing) is became necessary to meet the requirements of lithography process. The CMP is a planarization method by performing simultaneously a chemical reaction due to slurry and a mechanical process due to polishing pad. This method has an advantage of global planarization at a wide range of region that is impossible for the conventional BPSG(Boron-Phosphorous-Silicate-Glass) reflow or the SOG(Spin-On-Glass) etchback, also the CMP is able to perform a low temperature planarization.

Meanwhile, at the manufacturing of integrated circuits, when the spacing between patterns is small, for example the spacing is below 0.3 $\mu$m, gap filling matter is raised as a problem to be solved. And as solutions, HDP-CVD(High Density Plasma Chemical Vapor Deposition) manner, spin-on polymer coating manner and deposition of $O_3$-TEOS (Ozon-Tetra Ethyl Ortho Silicate) layer having excellent surface mobility have been proposed.

However, since the $O_3$-TEOS layer used to achieve the gap filling performance has a porous structure, an annealing step is further required to increase density of the $O_3$-TEOS layer after the deposition step. Although the density is increased by the annealing step, its layer quality is still inferior to that of a thermal oxide. Therefore, according to those results of CMP on the $O_3$-TEOS layer, a dishing is occurred at the regions of wide spacing between patterns. This dishing is also found not only in the $O_3$-TEOS layer but also in oxide layers and metals such as tungsten.

In the aspect of planarity, global planarity is affected by feature height, size, layout, density and polishing condition such as polishing mechanical parameters, pad and slurry. When the active area is wide and feature height is high, it is difficult to get planarized surface without additional scheme as mentioned above.

The CMP provides not the global planarity but excellent local planarity. Therefore, a selective CMP has been proposed to obtain excellent global planarity without occurring dishing. The selective CMP is believed to be a very useful polishing method of achieving global planarization since selective CMP uses polishing selectivity of materials to be polished simultaneously.

FIGS. 1A to 1C are sectional views illustrating a planarization method for semiconductor device in prior art using the selective CMP.

Referring to FIG. 1A, metal patterns 2 are formed on a semiconductor substrate 1 by an etching process using a hard mask layer 3. Those metal patterns 2 are formed to get pattern densities that are various depending on regions. An $O_3$-TEOS layer 4 having excellent gap filling characteristics is deposited over the semiconductor substrate 1. At this time, deposition thickness of the $O_3$-TEOS layer 4 is thicker at a portion having the metal pattern 2 than at a portion not having the metal pattern 2. And the deposition thickness is also thicker at a portion having high pattern density than at a portion having low pattern density. A BN layer or SiN layer, more preferably a BN layer 5 is formed on the $O_3$-TEOS layer 4 by a conventional plasma system having various depositing RF power.

Referring to FIG. 1B, the BN layer 5 is polished by the CMP step. Herein, the EN layer 5 over a region where the metal pattern 2 is formed, is polished while the BN layer 5 over wide range of regions where no metal pattern 2 is formed, is not polished and remained.

Referring to FIG. 1C, the $O_3$-TEOS layer 4 and the remained BN layer 5 are continuously polished by the CMP step until the hard mask layer 3 is exposed. As a result, global planarization is accomplished. Herein, as known in the art, the BN layer 5 has high polishing selectivity with respect to oxide layers or metals. For instance, the polishing rate of the BN layer 5 is slower than that of the oxide layers and metals. Accordingly, during the CMP step, the $O_3$-TEOS layer 4 is rapidly removed while the BN layer 5 is slowly removed. Therefore, the global planarization is obtained without occurring dishing at the wide range of region where no metal pattern 2 is formed.

However, the above described selective CMP requires additional BN depositing step thereby increasing manufacturing cost and decreasing production yield. Furthermore, device characteristics may be degraded by particles generated during the deposition step.

SUMMARY OF THE INVENTION

Therefore, the object of the present invention is to provide a planarization method for semiconductor device capable of obtaining the global planarization with a selective CMP without occurring any cost increase, degraded production yield or particle generation.

To accomplish the foregoing object of the present invention, the planarization method comprises following steps of: providing a semiconductor substrate in which metal patterns with various pattern densities are formed; depositing a porous oxide layer over the semiconductor substrate so as to cover the metal patterns; plasma-treating surface of the porous oxide layer; and polishing the plasma-treated porous oxide layer.

According to the present invention, an $O_3$-TEOS layer or PECVD oxide layer is used as porous oxide layer.

Further, according to the present invention, $N_2O$ or $NH_3$ gas is used as a plasma source gas during the plasma-treating step of the porous oxide layer, so that the surface of porous oxide layer is nitrified.

Also, according to the present invention, Ar, He or Ne gas is used as a plasma source gas during the plasma-treating step of the porous oxide layer, so that the surface of porous oxide layer is hardened.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

The planarization method of this invention reutilizes the shortcoming i.e. the porosity of $O_3$-TEOS layer. In other words, the surface of $O_3$-TEOS layer is nitrified or hardened by the plasma-treating step, such that the polishing rate of the $O_3$-TEOS layer is different between a surface portion and a bulk portion, thereby obtaining excellent global planarity.

FIGS. 2A to 2D are cross-sectional views illustrating a planarization method for semiconductor device of the present invention. Detailed description is as follows.

Figure 1A:
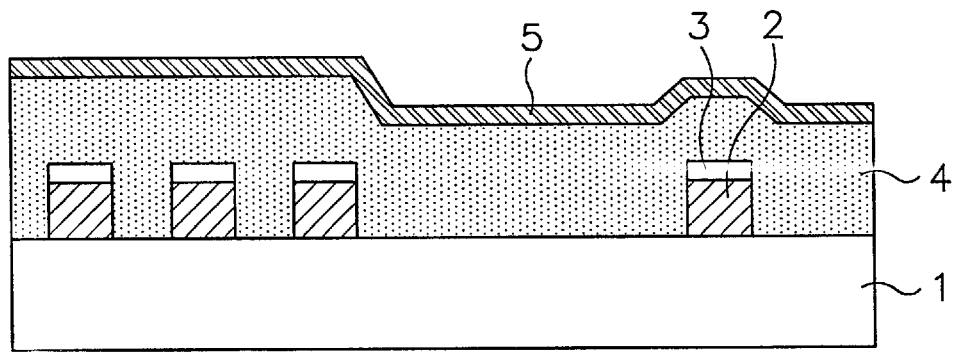
FIGS. 1A to 1C are cross-sectional views illustrating a planarization method for semiconductor device in prior art.
Figure 1B:
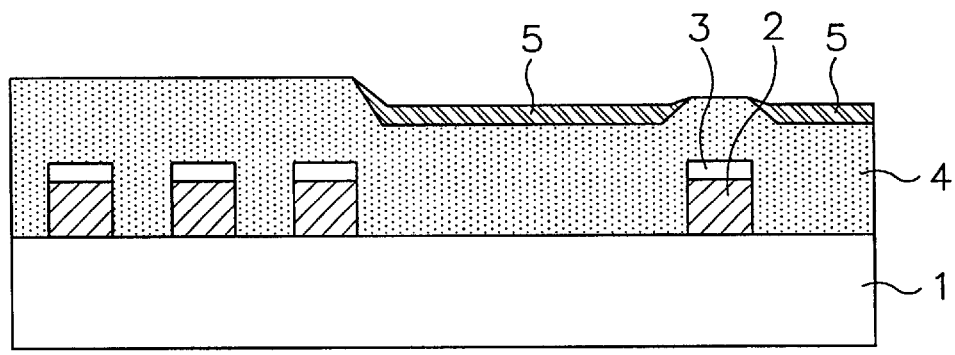
Figure 1C:
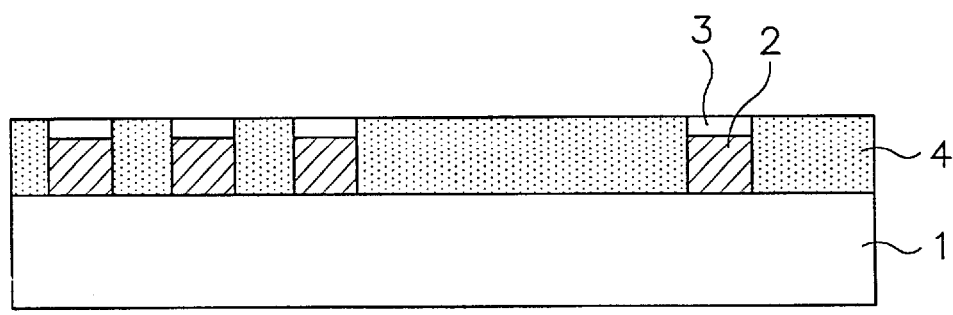
Figure 2A:
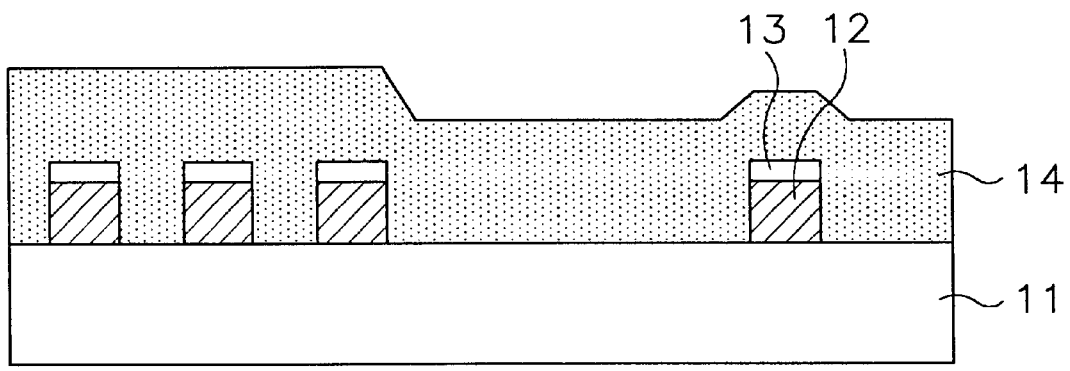
FIGS. 2A to 2D are cross-sectional views illustrating a planarization method for semiconductor device of the present invention.

Referring to FIG. 2A, metal patterns 12 having various pattern densities are formed on a semiconductor substrate 12. The metal patterns 12 are formed by an etching process using a hard mask layer 13 as an etching mask similar to that of the conventional methods. A porous oxide layer 14 such as $O_3$-TEOS layer having excellent gap filling characteristic is formed over the semiconductor substrate 11 so as to cover the metal patterns 12. A deposition thickness of the $O_3$-TEOS layer 14 is thicker at a portion having the metal pattern 12 than at a portion not having the metal pattern 12. And the deposition thickness is also thicker at a portion having high pattern density than at a portion having low pattern density. As a porous oxide layer, an oxide layer deposited according to the PECVD process can be used instead the $O_3$-TEOS layer 14.

Figure 2B:
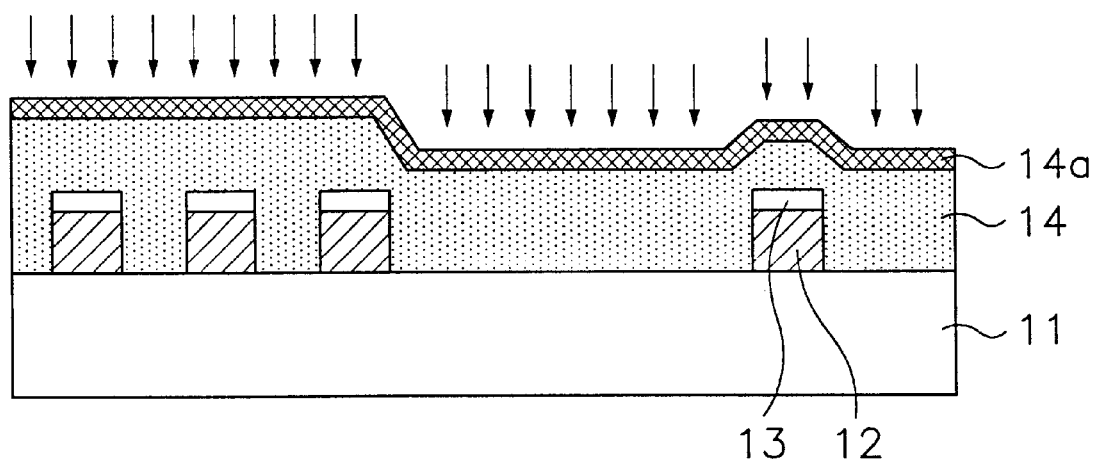

Referring to FIG. 2B, the $O_3$-TEOS layer 14 is plasma-treated by a plasma source gas such as $N_2O$ or $NH_3$. During the plasma-treating step, a shrinking in the surface of the $O_3$-TEOS layer 14 is occurred owing to a radical bombardment and the radicals fill voids on the film surface, thereby nitrifying the surface of the $O_3$-TFOS layer 14. As a result, there is formed a surface layer 14a made of nitride having polishing selectivity with respect to the $O_3$-TEOS layer 14 on the surface of the $O_3$-TEOS layer 14. Since the surface layer 14a made of nitride is formed by plasma-treating the $O_3$-TEOS layer 14, no further deposition step for forming the surface layer 14a made of nitride and no particle generation due to the deposition step is occurred.

Figure 2C:
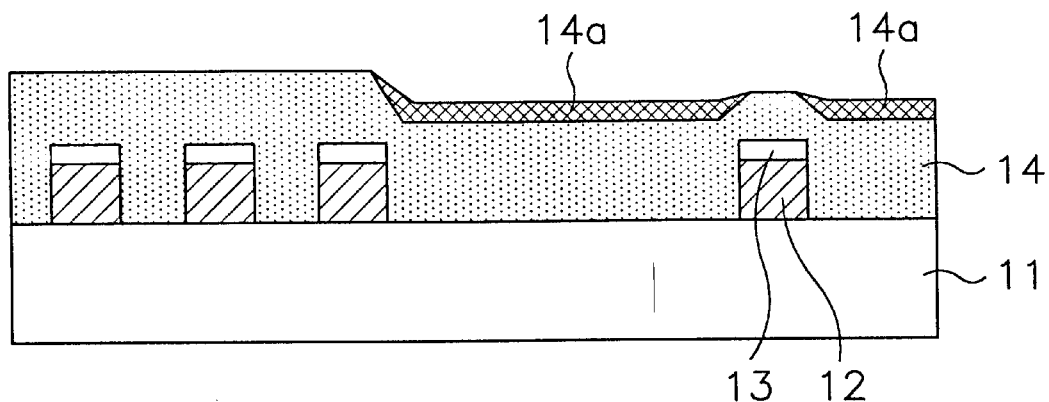

Referring to FIG. 2C, the $O_3$-TEOS layer 14 is annealed to increase its density, and then the $O_3$-TEOS layer 14 including the surface layer 14a made of nitride is polished according to the CMP step. At this time, the surface layer 14a formed on the metal pattern 12 and at a portion of high density is removed, while the surface layer 14a formed at wide range of regions where no metal pattern 12 is formed is remained.

Figure 2D:
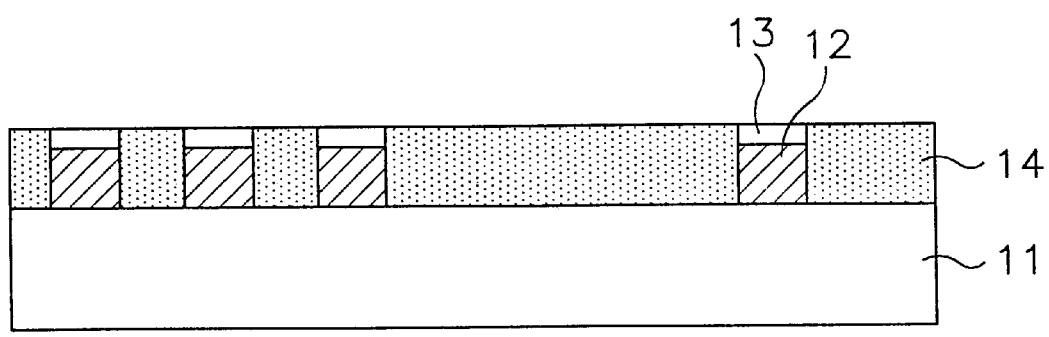

Referring to FIG. 2D, the remained surface layer 14a and the $O_3$-TEOS layer 14 are continuously polished according to the CMP step until the hard mark layer 13 is exposed. Herein, as mentioned above, since the nitride layer has relatively slow polishing rate compared with that of oxide layer, the polishing rate of the surface layer 14a made of nitride is slower than that of bulk of the $O_3$-TEOS layer 14.

Accordingly, without occurring dishing at the wide range of regions where no metal pattern 12 is formed, global planarization is obtained.

Therefore, according to the present invention, excellent global planarization with a selective CMP step is provided without occurring additional BN layer deposition step since the surface layer made of nitride is formed at the surface of $O_3$-TEOS layer by plasma-treating the surface of the $O_3$-TEOS layer.

In another embodiment of the present invention, instead using the plasma nitride source gas such as $N_2O$ or $NH_3$, Ar is used as a plasma source gas. Also He or Ne can be used as a plasma source gas. In this case, as the $O_3$-TEOS layer is plasma-treated by Ar, He or Ne gas, voids on the surface of the $O_3$-TEOS layer are removed, and at the same time Ar ions are filled in the voids thereby hardening the surface of the $O_3$-TEOS layer. Herein, He or Ne ions can be filled in the voids. At this time, the hardened $O_3$-TEOS layer surface has a polishing selectivity with respect to a bulk of the same, for example the hardened surface has a slow polishing rate compared with that of the bulk.

Accordingly, when the $O_3$-TEOS layer having the hardened surface is polished by the CMP step, owing to the difference of polishing rate between the hardened $O_3$-TEOS layer surface and the bulk, excellent global planarization is obtained without occurring dishing at wide range of regions where no metal pattern is formed as described in the previous embodiment of the present invention.

Although preferred embodiments of the present invention are described and illustrated, various other modifications will be apparent to and can be readily made by those skilled in the art without departing from the scope and spirit of the present invention.

What is claimed is:

1. A planarization method for semiconductor device comprising the steps of:

providing a semiconductor substrate in which metal patterns are formed with various pattern densities;

depositing a porous oxide layer over the semiconductor substrate as so to cover the metal patterns;

plasma-treating surface of the porous oxide layer, thereby hardening the surface of the porous oxide layer; and polishing the hardened surface of the porous oxide layer by chemical mechanical polishing.

2. The method of claim 1, wherein the porous oxide layer is one of an $O_3$-TEOS layer and oxide layer deposited by plasma-enhanced chemical vapor deposition process.

3. The method of claim 1, further comprising a step of annealing the plasma-treating porous oxide layer between the steps of plasma-treating the surface of the porous oxide layer and polishing the plasma-treated porous oxide layer.

4. The method of claim 1, wherein Ar, He or Ne is used as a plasma source gas in the step of plasma-treating of the porous oxide layer.

5. A planarization method for semiconductor device comprising the steps of:

providing a semiconductor substrate in which metal patterns are formed with various pattern densities;

depositing a porous oxide layer over the semiconductor substrate as so to cover the metal patterns, wherein the porous oxide layer is one of an $O_3$-TEOS layer and oxide layer deposited by plasma-enhanced chemical vapor deposition process;

plasma-treating surface of the porous oxide layer by using He or Ne as a plasma source gas, thereby hardening the surface of the porous oxide layer; and polishing the hardened porous oxide layer by chemical mechanical polishing, thereby decreasing a step between the metal patterns and the porous oxide layer.

6. The method of claim 5, further comprising a step of annealing the plasma-treating porous oxide layer between the steps of plasma-treating the surface of the porous oxide layer and polishing the plasma-treated porous oxide layer.

7. A planarization method for semiconductor device comprising the steps of:

providing a semiconductor substrate in which metal patterns are formed with various pattern densities;

depositing a porous oxide layer over the semiconductor substrate to cover the metal patterns, wherein the porous oxide layer is an $O_3$-TEOS layer or oxide layer deposited by plasma-enhanced chemical vapor deposition process;

plasma-treating surface of the porous oxide layer by $N_2O$ or $NH_3$ as a plasma source gas; and polishing the plasma-treated porous oxide layer by chemical mechanical polishing, thereby decreasing a step between the metal patterns and the porous oxide layer.

8. The method of claim 7, further comprising a step of annealing the plasma-treating porous oxide layer, between the steps of plasma-treating the surface of the porous oxide layer and polishing the plasma-treating porous oxide layer.

* * * * *